(12) United States Patent
Sun et al.

(10) Patent No.: US 11,374,554 B2
(45) Date of Patent: Jun. 28, 2022

(54) APPARATUS AND METHOD OF IMPLEMENTING A COMPACT AND TUNABLE MICROWAVE RESONATOR USING NBN KINETIC INDUCTANCE

(71) Applicant: Nanjing University, Nanjing (CN)

(72) Inventors: Guozhu Sun, Nanjing (CN); Xingyu Wei, Nanjing (CN); Jiazheng Pan, Nanjing (CN); Qingyuan Zhao, Nanjing (CN); Peiheng Wu, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 268 days.

(21) Appl. No.: 16/839,068

(22) Filed: Apr. 2, 2020

(65) Prior Publication Data

US 2021/0257995 A1    Aug. 19, 2021

(30) Foreign Application Priority Data

Feb. 19, 2020   (CN) .......................... 202010101138.6

(51) Int. Cl.
*H03J 3/22*   (2006.01)
*H01P 7/06*   (2006.01)

(52) U.S. Cl.
CPC . *H03J 3/22* (2013.01); *H01P 7/06* (2013.01)

(58) Field of Classification Search
CPC ..................................... H03J 3/22; H01P 7/06
See application file for complete search history.

(56) References Cited

FOREIGN PATENT DOCUMENTS

WO    WO-2020180885 A1 *  9/2020

\* cited by examiner

*Primary Examiner* — Metasebia T Retebo
(74) *Attorney, Agent, or Firm* — Cheng-Ju Chiang

(57) ABSTRACT

An apparatus and method for implementing a compact and tunable microwave resonator using NbN kinetic inductance, comprising: a DC source, an attenuator, an oxygen-free copper cavity, a superconducting coil, a first-stage amplifier, a second-stage amplifier, a vector network analyzer and a control computer, a small-sized tunable resonator whose size is reduced by 10-20 times as compared with an ordinary thin film microwave resonator is implemented in a microwave frequency band by using high kinetic inductance of an ultra-thin NbN thin film in a superconducting state, the tunability of the resonator lies in that the ultra-thin NbN thin film serves as the LC resonance circuit, a dc-SQUID is connected to the end of the resonator, and a change in the external magnetic field causes a change in the equivalent inductance of the dc-SQUID, thereby changing the total inductance of the resonator and modulating the resonant frequency of the resonance circuit.

7 Claims, 8 Drawing Sheets

APPARATUS AND METHOD OF IMPLEMENTING A COMPACT AND TUNABLE MICROWAVE RESONATOR USING NBN KINETIC INDUCTANCE

TECHNICAL FIELD

The present invention relates to the field of superconducting quantum circuit integration, and specifically to an apparatus and method of implementing a compact and tunable microwave resonator using niobium nitride (NbN) kinetic inductance.

BACKGROUND

Quantum computing is a hot spot of current scientific research. A superconducting quantum circuit serves as a basic element of a quantum computer, and its computing capability is directly related to the number of bits carried by the circuit. Compared with Moore's Law, the performance of the quantum computer will exponentially develop along with the number of bits. To achieve a higher computing capability, the number of bits needs to be increased continuously. As such, the area of the whole chip will increase accordingly, thereby affecting applicability of the quantum computer, so its integration degree needs to be improved accordingly. Most of the area of a traditional superconducting qubit circuit is occupied by a qubit readout circuit, namely, a superconducting resonator, and its area generally exceeds 90% of the entire circuit. A qubit that is really used for computing only occupies a very small area, which means that the size of a single qubit computing unit is limited by the size of the readout circuit. A general qubit readout circuit uses a thicker Al or Nb film as its superconducting material, and its kinetic inductance is negligible compared with the geometric inductance. This means that at the same resonance frequency, the geometric size of its readout circuit is larger than the geometric size of a material with a high kinetic inductance, and is generally about 10 mm in a microwave band (4-8 GHz). This means that the size of a single qubit computing unit is large and it is difficult to improve the integration degree of the chip.

SUMMARY

An object of the present invention: in view of the above problems and drawbacks existing in the prior art, an object of the present invention is to implement a compact microwave resonator using kinetic inductance of an ultra-thin niobium nitride (NbN) thin film, reduce the size of a readout circuit resonator in a superconducting quantum circuit, and meanwhile use a dc-SQUID (direct current superconducting quantum interference device) to implement real-time tuning of the resonance frequency of a NbN resonator by changing a magnitude of a magnetic field at a low temperature.

Technology solutions: In order to achieve the above-mentioned object of the invention, a first embodiment of the present invention provides an apparatus for implementing a compact and tunable microwave resonator using NbN kinetic inductance, wherein the apparatus comprises:

a direct current (DC) source, a superconducting coil, an attenuator, an oxygen-free copper cavity, a first-stage amplifier, a second-stage amplifier, a vector network analyzer and a control computer, wherein the oxygen-free copper cavity and the superconducting coil are at a low temperature of 30 mK and configured to carry a NbN resonator sample and provide a magnetic field, respectively; the attenuator and the first-stage amplifier are in a low-temperature environment of a dilution refrigerator, and the DC source, the second-stage amplifier, the vector network analyzer and the control computer are all in a room temperature environment; the DC source is used to provide a voltage needed by the superconducting coil to generate the magnetic field, the superconducting coil is used to provide an externally-applied magnetic field needed by the NbN resonator sample, the vector network analyzer is used to provide a microwave signal to the NbN resonator sample as a microwave input signal which is input through the attenuator into the NbN resonator sample to drive an inductor-capacitor (LC) resonance circuit, an input of the first-stage amplifier is connected to an output of the oxygen-free copper cavity so that the first-stage amplifier amplifies the output microwave signal at a low temperature an input of the second-stage amplifier is connected to an output of the first-stage amplifier to receive the output signal of the first-stage amplifier for further amplification at a normal temperature, the vector network analyzer is used to measures a forward transmission coefficient S21 curve from an input port to an output port of the NbN resonator sample and observe a modulation effect of the magnetic field for the resonance frequency of the LC resonance circuit; the control computer is connected to the vector network analyzer and used to record data measured by the vector network analyzer.

Further, wherein the vector network analyzer is simultaneously connected to an input of the attenuator and an output of the second-stage amplifier.

Further, wherein the DC source is connected to the superconducting coil to provide the externally-applied magnetic field.

Further, wherein the output of the second-stage amplifier is directly connected to the vector network analyzer for test.

Further, wherein small A type (SMA) connectors are mounted on both sides of a base of the oxygen-free copper cavity and respectively serves as an input and an output, a printed circuit board (PCB) is mounted on the base of the oxygen-free copper cavity, and the NbN resonator sample is located in a groove of the PCB; a first central conductor of the SMA connector is connected with a second central conductor of the PCB through soldering tin, the second central conductor is connected with a coplanar waveguide transmission line of the NbN resonator sample through an aluminum wire, a lid of the oxygen-free copper cavity is mounted with a coil bobbin, and the superconducting coil is wound on the coil bobbin.

Further, wherein the NbN resonator sample comprises a silicon substrate, a NbN film ground plane, an impedance transformation line and a LC resonance circuit; the silicon substrate is configured as a carrier of the entire NbN resonator sample, the NbN film ground plane, the impedance transformation line and the LC resonance circuit are all fabricated on the silicon substrate, the impedance transformation line is located in the middle of the silicon substrate, and the LC resonance circuit is distributed on one side of the impedance transformation line.

Further, wherein the LC resonance circuit comprises a coupling capacitor, a resonator central conductor and a dc-SQUID; the resonator central conductor is made of a 5-10 nanometer-thick NbN film; the coupling capacitor is configured as a gap capacitor between the resonator central conductor and the impedance transformation line, and both ends of the dc-SQUID are respectively connected to the resonator central conductor and a NbN film ground plane.

A second embodiment of the present invention provides a method for implementing a compact and tunable microwave resonator using NbN kinetic inductance, comprising the following steps:

(1) connecting a vector network analyzer to an input of an attenuator and an output of a second-stage amplifier, respectively, a microwave signal generated by the vector network analyzer being input to an oxygen-free copper cavity carrying a NbN resonator sample through the attenuator and a SMA connector, being coupled to a LC resonance circuit through a second central conductor of a PCB and an impedance transformation line of the NbN resonator sample and through a coupling capacitor, and then being output from an output of the oxygen-free copper cavity to obtain a microwave output signal which is amplified through the first-stage amplifier and second-stage amplifier and enters an input of the vector network analyzer, so that a forward transmission coefficient $S_{21}$ curve from an input port to an output port of the NbN resonator sample can be measured, and absorption peaks can be observed;

(2) outputting a voltage from a DC source to cause a superconducting coil to generate a desired magnetic field;

(3) upon observing a change in the absorption peak frequency obtained by step (1) and discovering the resonance frequency periodically changes with the voltage applied in step (2), implementing the modulation of the NbN resonator frequency by tuning the voltage to generate the magnetic field;

(4) obtaining the NbN resonator frequency that changes periodically by using a control computer to collect a value of an input voltage of the DC source and data of the forward transmission coefficient $S_{21}$ curve.

Advantageous effects: the present invention provides an apparatus and method of implementing a compact and tunable microwave resonator using NbN kinetic inductance, whereby a small-sized resonator whose size is reduced by 10-20 times as compared with an ordinary superconducting resonance circuit may be fabricated using high kinetic inductance of the ultra-thin NbN thin film on a silicon substrate in a superconducting state. Such as the ordinary superconducting resonance circuit has a size of about 10 mm in the same frequency band (4-8 GHz), the present invention may achieve a size 600 μm. Meanwhile, since the dc-SQUID has inductance tunable, it is possible to change the inductance of the dc-SQUID by tuning an externally-applied magnetic field, thereby changing the inductance of the entire NbN resonator and thereby changing its resonance frequency. As compared with the ordinary superconducting quantum resonance circuit, this task has advantages such as small size and low power consumption so that the number of quantum readout circuits carried by the chip of the same size increases. Meanwhile, the apparatus and method according to the present disclosure exhibit tunability and convenience, can change the frequency of the NbN resonator in real time, and are of great significance for integration research and application of the quantum circuits.

DETAILED DESCRIPTION

The present invention will be further illustrated with reference to figures and specific embodiments. It should be appreciated that these embodiments are only intended to illustrate the present invention not to limit the scope of the present invention. Various equivalent modifications to the present invention made by those skilled in the art after reading through the present invention all fall within the scope defined by the appended claims of the present application.

Figure 1:
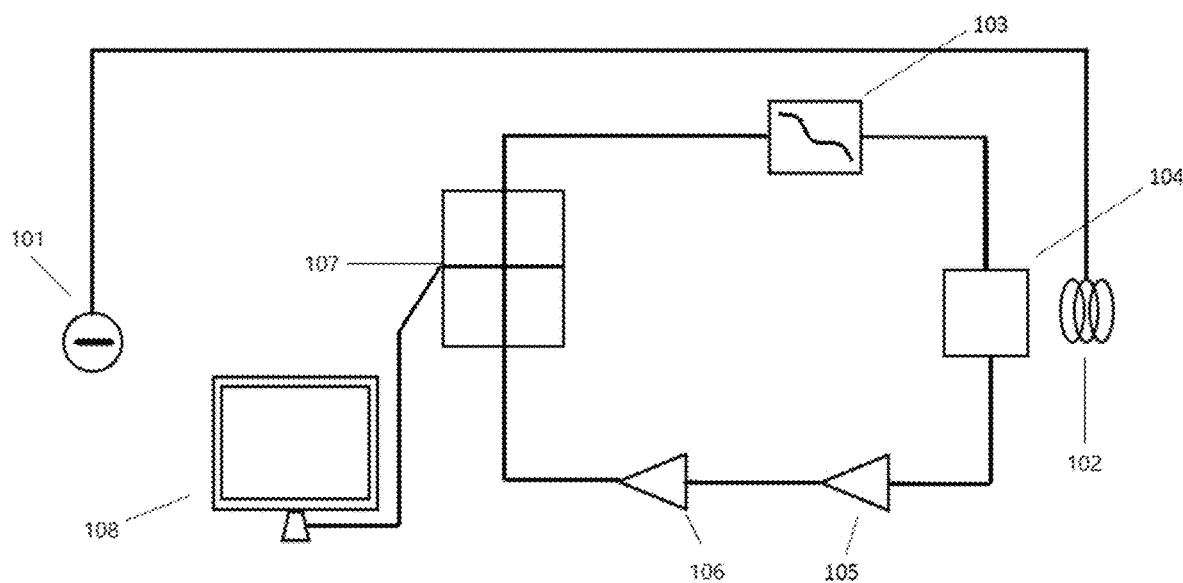
FIG. 1 is a schematic structural diagram of an apparatus for implementing a compact and tunable microwave resonator using NbN kinetic inductance.
Figure 2:
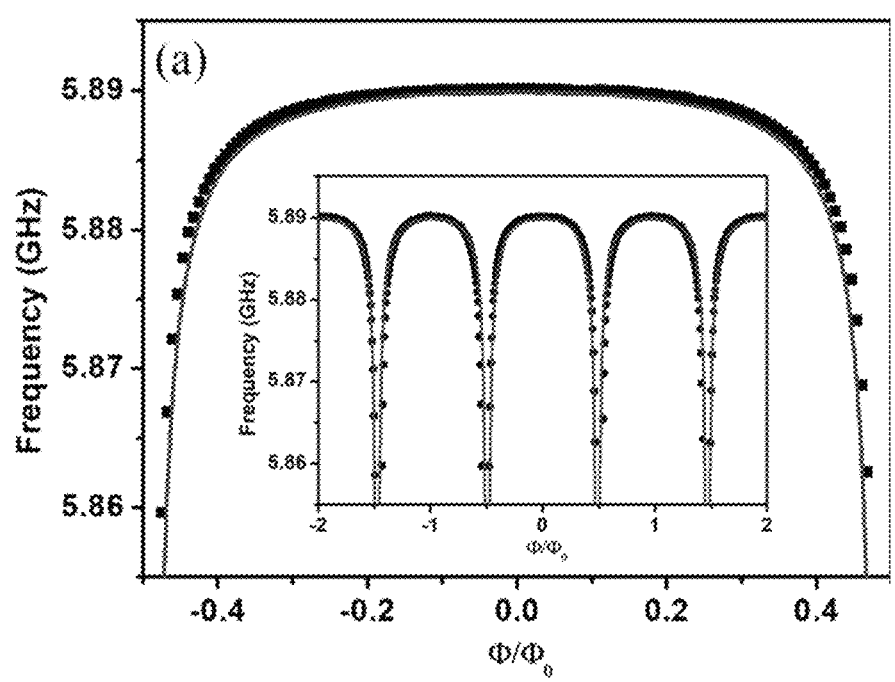
FIG. 2 is a schematic diagram of a modulation effect of implementing a compact and tunable microwave resonator using NbN kinetic inductance.

As shown in FIG. 1, an apparatus for implementing a compact and tunable microwave resonator using niobium nitride (NbN kinetic inductance according to an embodiment of the present invention mainly includes: a direct current (DC) source 101, a superconducting coil 102, an attenuator 103, an oxygen-free copper cavity 104, a first-stage amplifier 105, a second-stage amplifier 106, a vector network analyzer 107 and a control computer 108. During the measurement, the oxygen-free copper cavity 104 and the superconducting coil 102 are at a low temperature of 30 mK, the attenuator 103 and the first-stage amplifier 105 are in a low-temperature environment of a dilution refrigerator, and the remaining devices such as the DC source 101, the second-stage amplifier 106, the vector network analyzer 107 and the control computer 108 are in a room temperature environment. The vector network analyzer 107 connects an input of the attenuator 103 and connects an output of the second-stage amplifier 106, a microwave signal is input to and attenuated by the attenuator 103 and then enters the oxygen-free copper cavity 104 to drive the superconducting resonance circuit. At the same time, a bias voltage of the DC source 101 is modulated to provide an electrical current to the superconducting coil 102 to generate a magnetic field, an output microwave signal departs from the oxygen-free copper cavity 104 and passes through the first-stage amplifier 105 and the second-stage amplifier 106, an input of the second-stage amplifier 106 is connected to the output of the first-stage amplifier 105 to receive the output signal of the first-stage amplifier 105 for further amplification, and the output signal returns to the vector network analyzer 107 which at this time, measures a forward transmission coefficient $S_{21}$ curve from the input port to the output port of the superconducting resonance circuit and observe the modulation effect of the magnetic field for the resonance frequency. In the measurement, the vector network analyzer 107 is capable of measuring three absorption peaks which are of the superconducting resonance circuit and change with the magnetic field. The modulation effect is shown in FIG. 2: a horizontal axis represents a magnitude of a normalized magnetic flux passing through the dc-SQUID (direct current superconducting quantum interference device), where $\Phi$ represents the magnetic flux passing through the dc-SQUID, and $\Phi_0$ represents the magnetic flux quantum; a vertical axis represents a frequency corresponding to the measured NbN resonator absorption peaks. The frequency of the NbN resonator changes with the externally-applied magnetic flux, and has a periodicity as shown in FIG. 2.

Figure 3A:
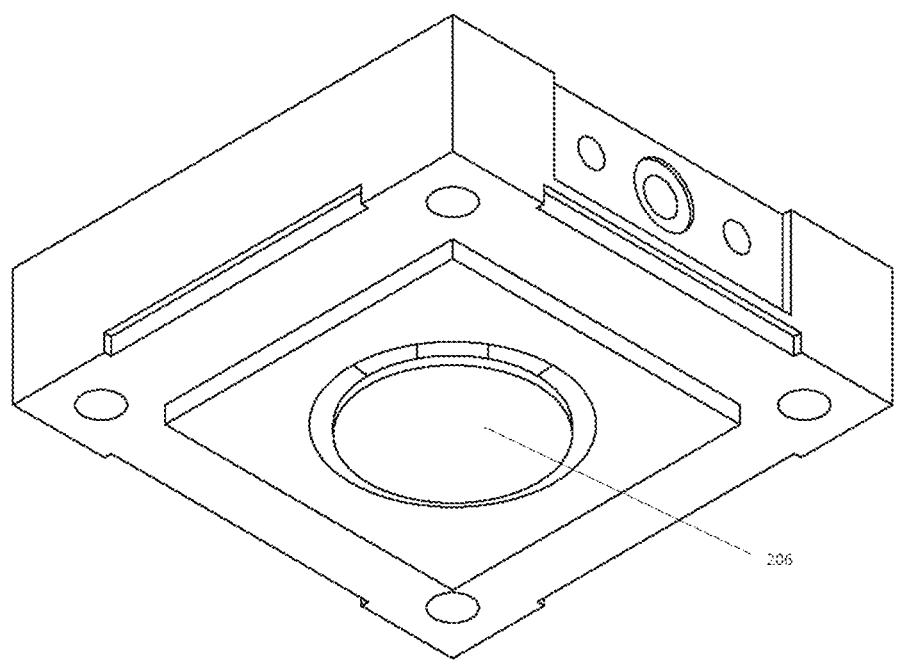
FIG. 3(a) is a schematic structural diagram of a lid of an oxygen-free copper cavity.
Figure 3B:
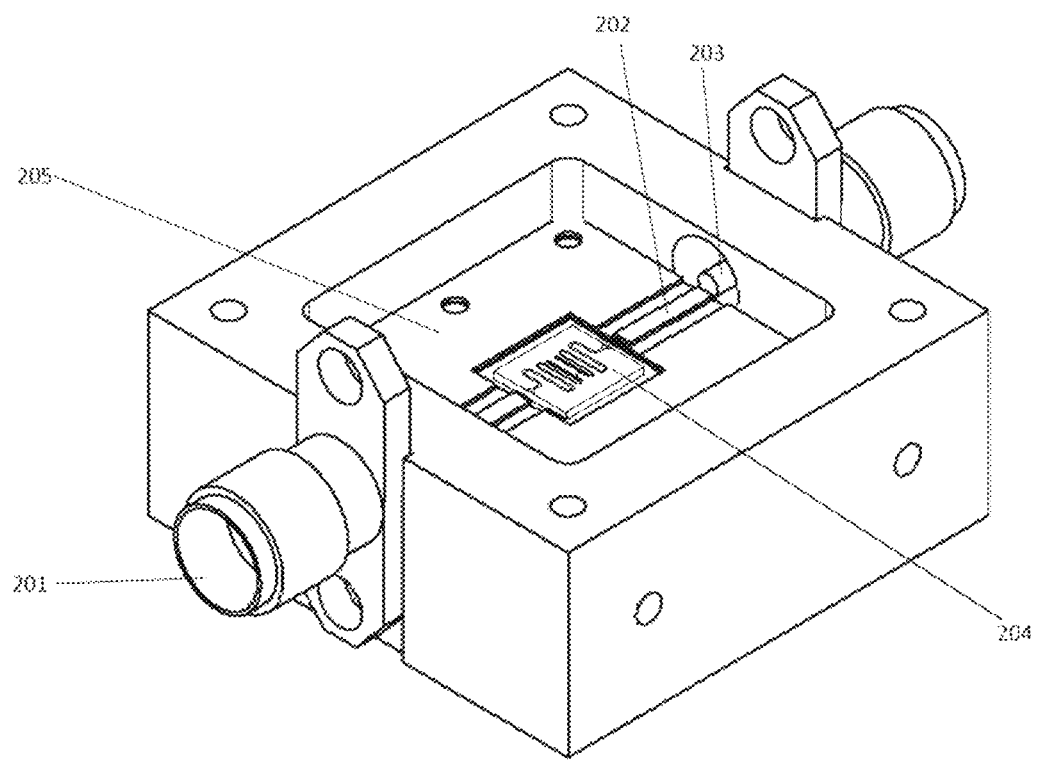
FIG. 3(b) is a schematic structural diagram of a base of an oxygen-free copper cavity.

As shown in FIG. 3(a) and FIG. 3(b), the oxygen-free copper cavity 104 of an embodiment of the present invention is mainly used to carry a NbN resonator sample 204. A lid of the oxygen-free copper cavity 104 is mounted with a coil bobbin 206 for holding the superconducting coil 102. A round hole is provided on both sides of the base of the oxygen-free copper cavity 104, and aims to mount a small A type (SMA) connector 201 on both sides of the base and allow a first central conductor 203 of the SMA connector 201 to enter the interior of the oxygen-free copper cavity 104. A printed circuit board (PCB) 205 is fixed in the interior of the oxygen-free copper cavity 104 through screw holes. The NbN resonator sample 204 is placed in a central internal groove of the PCB 205. The first central conductor 203 of the SMA connector 201 and a second central conductor 202 of the PCB 205 are soldered together through soldering tin, and meanwhile the first central conductor 203 of the SMA connector 201 and an impedance transformation line 302 of the NbN resonator sample 204 are spot-welded together through an aluminum wire, so that the microwave input signal may pass through the first central conductor 203 of the SMA connector 201 and the second central conductor 202 of the PCB 205 in turn and then enter the impedance transformation line 302 on the NbN resonator sample 204. The microwave input signal is coupled to an inductor-capacitor (LC) resonance circuit 304 on a side of the impedance transformation line 302 through the impedance transformation line 302, namely, the electromagnetic energy is transferred to the LC resonance circuit 304 to generate electromagnetic oscillation.

Figure 4:
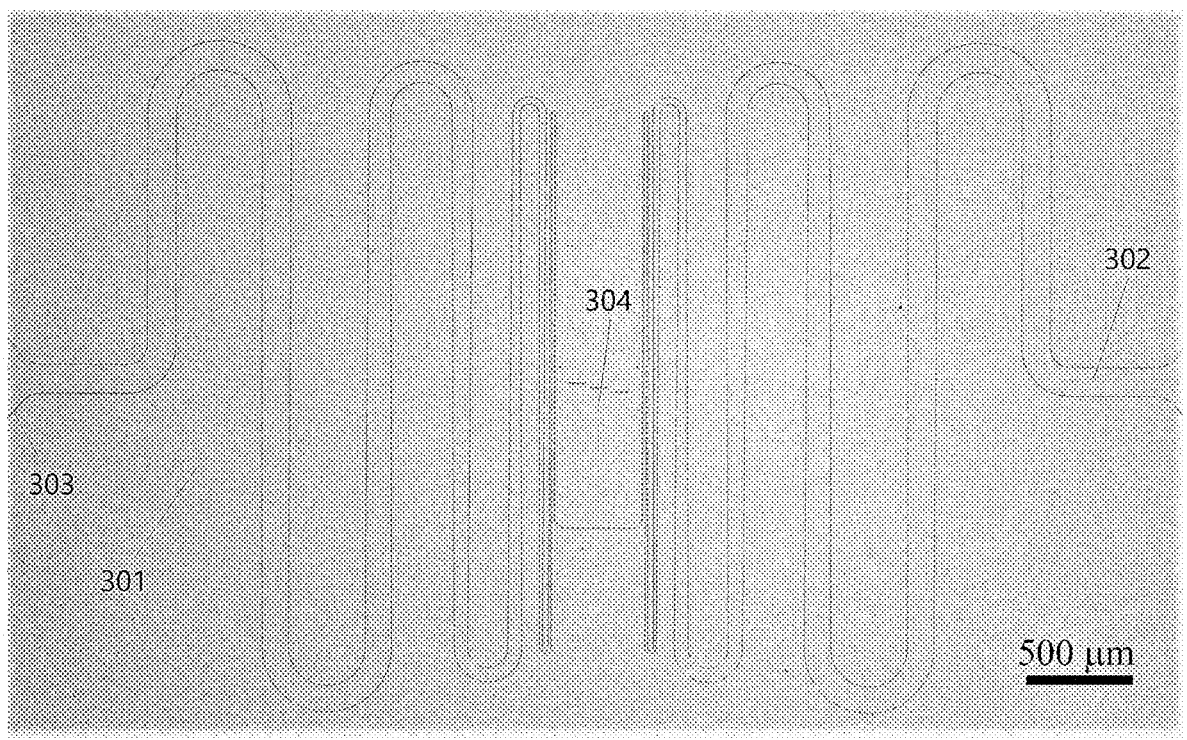
FIG. 4 is a schematic diagram of a sample of a NbN resonator.

As shown in FIG. 4, the figure is a schematic diagram of a NbN resonator sample 204 based on an ultra-thin NbN thin film according to an embodiment of the present invention. The NbN resonator sample 204 is a resonator sample with a 500 μm-thick silicon substrate manufactured by a micromachining process, a 5-10 nm-thick NbN thin film and an about 6*6 $mm^2$ chip area, and mainly comprises a silicon substrate 303, a NbN film ground plane 301, an impedance transformation line 302 and a LC resonance circuit 304. Since the entire preparation process of the NbN resonator sample 204 is compatible with the semiconductor process, silicon is used as the substrate, and the process involves micromachining processes such as magnetron sputtering for NbN film, photoresist coating, electron beam exposure, development and RIE etching. The silicon substrate 303 is a carrier of the entire NbN resonator sample 204. The NbN film ground plane 301, the impedance transformation line 302 and the LC resonance circuit 304 are all fabricated on the silicon substrate 303. The impedance transformation line 302 is located in the middle of the silicon substrate 303. The materials of the impedance transformation line 302 and the NbN film ground plane 301 are both a 5-10 nm-thick NbN film, and its kinetic inductance in the superconducting state far exceeds the geometric inductance. The impedance transformation line 302 is responsible for inputting and outputting the microwave signal and implementing impedance matching with the LC resonance circuit 304. Therefore, the impedance transformation line 302 is connected with the second central conductor 202 of the PCB 205 and coupled to the LC resonance circuit 304 by a coupling capacitor, the NbN film ground plane 301 is spot-welded together with the ground plane of the PCB 205 using an aluminum wire. Since there are three LC resonance circuits 304 on the side of the impedance transformation line 302 of the NbN resonator sample 204, when the microwave input signal enters from the impedance transformation line 302 the microwave input signal will be coupled with the LC resonance circuit 304 nearby the impedance transformation line 302, and the microwave energy enters the LC resonance circuit 304 and forms electromagnetic oscillations. At this time, three absorption peaks (such as 5.89 GHz, 6.09 GHz and 6.29 GHz) can be observed using the vector network analyzer 107.

Figure 5A:
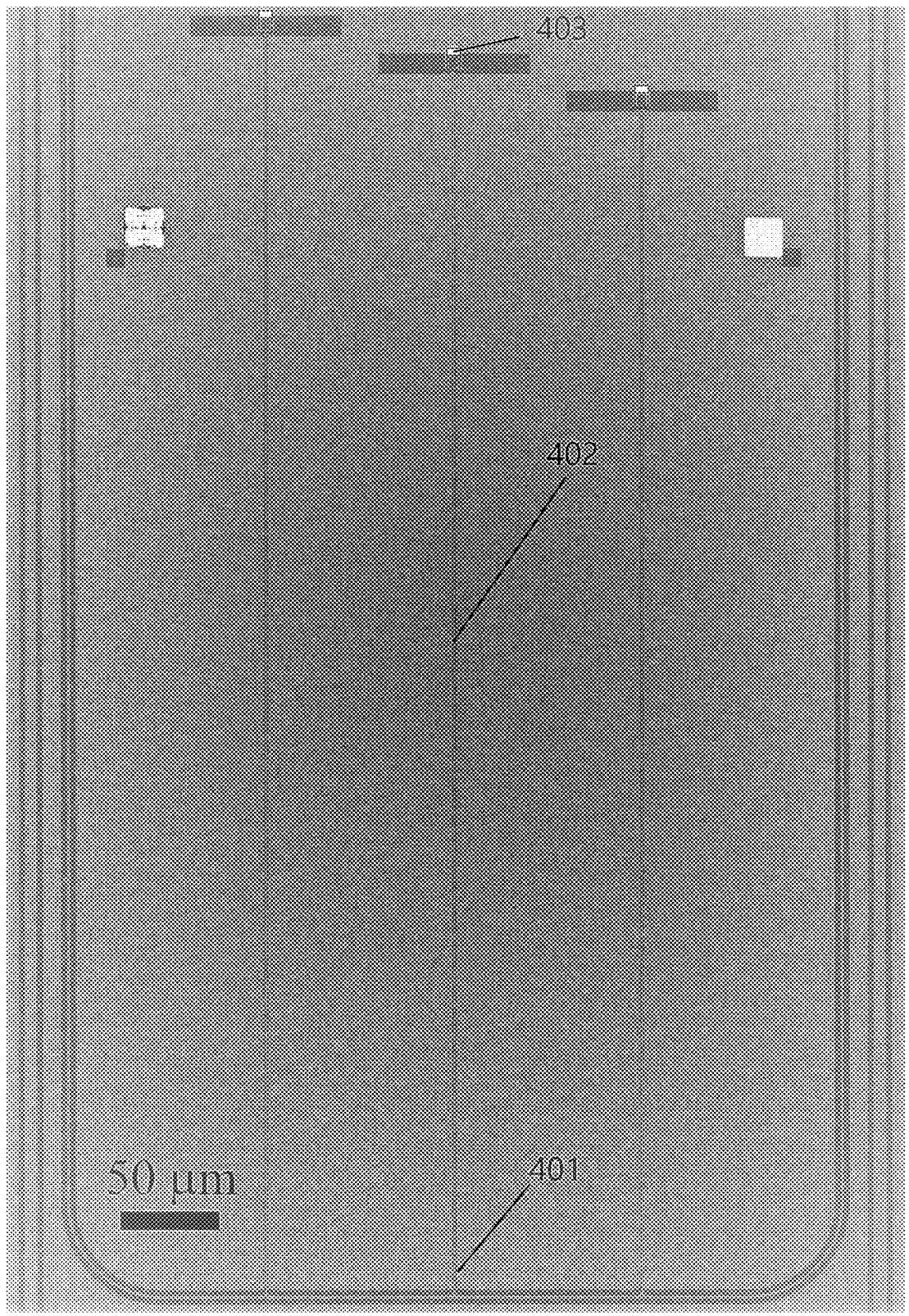
FIG. 5(a) is a schematic diagram of a LC resonance circuit.
Figure 5B:
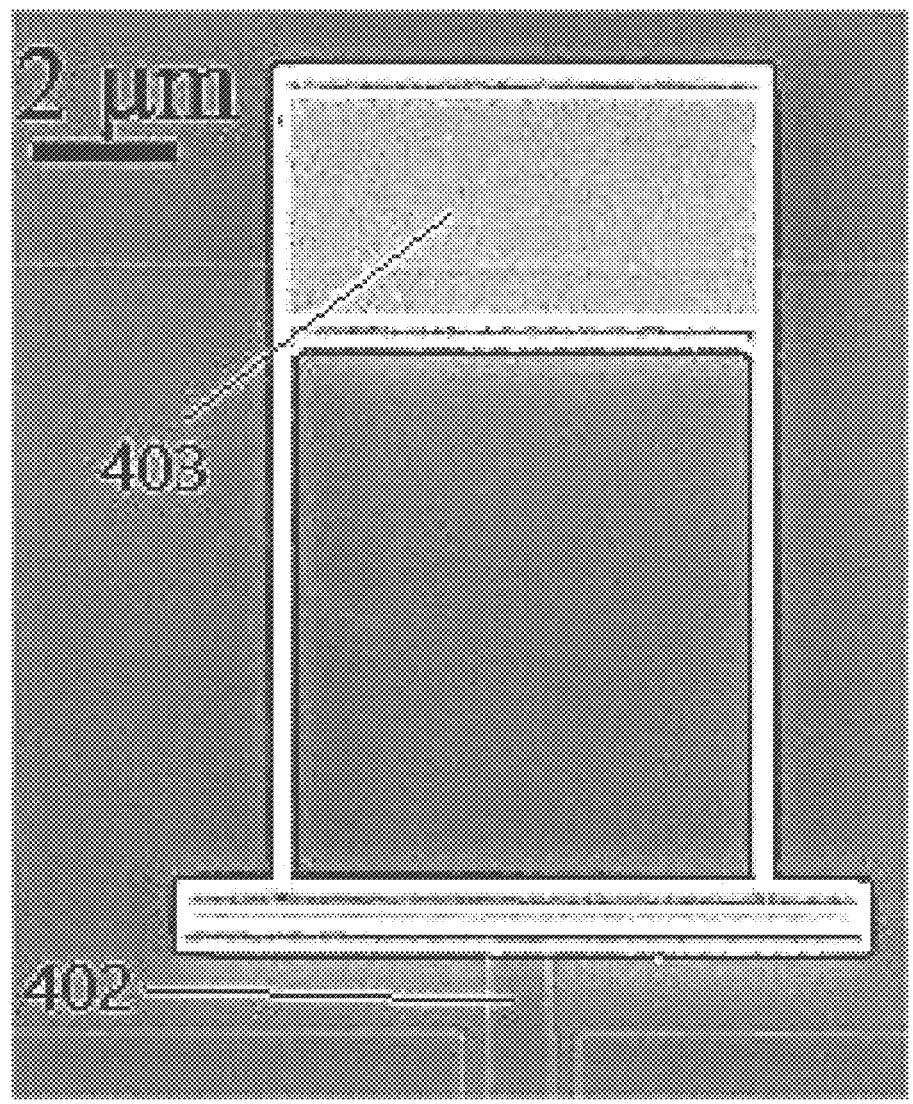
FIG. 5(b) is a first partially-enlarged view of FIG. 5(a)
Figure 5C:
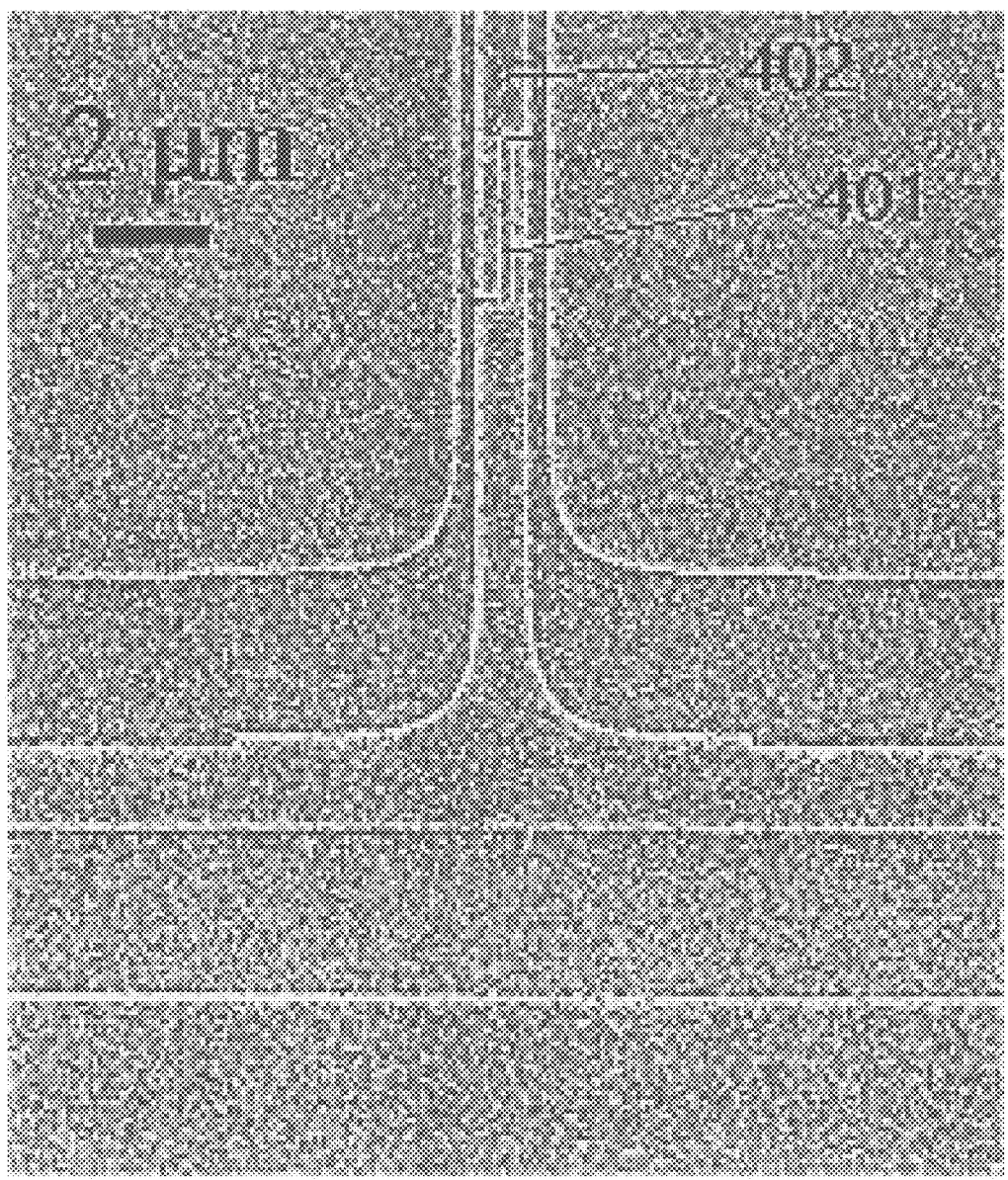
FIG. 5(c) is a second partially-enlarged view of FIG. 5(a).

FIG. 5(a), FIG. 5(b) and FIG. 5(c) show schematic diagrams (including partially-enlarged views) of three LC resonance circuits 304 of an embodiment of the present invention, and mainly include a coupling capacitor 401, a resonator central conductor 402 and a dc-SQUID 403. The coupling capacitor 401 functions to couple the LC resonance circuit 304 with the impedance transformation line 302, and the capacitance is about 0.7 fF. The three resonator central conductors 402 have a width of 1 μm and a length of 621 μm, 641 μm and 661 μm, respectively. A gap between the resonator central conductor 402 and the NbN film ground plane 301 is 0.3 μm. As such, there is inductance per unit length and capacitance per unit length between the resonator central conductor 402 and NbN film ground plane 301 to form a LC resonance circuit; the dc-SQUID 403 at the end of NbN resonator sample 204 is made of superconducting aluminum, one end of the dc-SQUID 403 contacts the resonator central conductor 402, and the other end contacts the NbN film ground plane 301 to form a non-linear inductance device. When a magnetic field passes through the dc-SQUID 403, a superconducting current is generated on the dc-SQUID 403, which further affects the equivalent inductance of the dc-SQUID 403, causing the total inductance of the LC resonance circuit 304 to change and thereby changing the resonance frequency. Therefore, it is possible to tune the resonance frequency of the LC resonance circuit 304 by applying a bias voltage through the DC source 101 and generating a magnetic field in the superconducting coil 102.

A method for modulating a NbN resonator frequency in real time using a magnetic field comprises the following steps:

(1) connecting the vector network analyzer to the input of the attenuator and the output of the second-stage amplifier, respectively, i.e., the microwave signal generated by the vector network analyzer being input to the oxygen-free copper cavity carrying the NbN resonator sample through the attenuator and the SMA connector, being coupled to the LC resonance circuit through the second central conductor of the PCB and the impedance transformation line of the NbN resonator sample and through a capacitor, and then being output from the output of the oxygen-free copper cavity to obtain a microwave output signal which is amplified through the first-stage amplifier and second-stage amplifier and enters the input of the vector network analyzer, so that a forward transmission coefficient $S_{21}$ curve from the input port to the output port of the NbN resonator sample can be measured;

(2) outputting a voltage from the DC source to cause the superconducting coil to generate a desired magnetic field;

(3) upon observing a change in the absorption peak frequency obtained by step (1) and discovering the resonance frequency periodically changes with the voltage applied in step (2) (as shown in FIG. 2), implementing the modulation of the NbN resonator frequency by tuning the voltage to generate the magnetic field;

(4) obtaining the NbN resonator frequency that changes periodically by using a control computer to collect a value of an input voltage of the DC source and data of the forward transmission coefficient $S_{21}$ curve.

What is claimed is:

1. An apparatus for implementing a compact and tunable microwave resonator using niobium nitride (NbN) kinetic inductance, wherein the apparatus comprises:

a direct current (DC) source, a superconducting coil, an attenuator, an oxygen-free copper cavity, a first-stage amplifier, a second-stage amplifier, a vector network analyzer and a control computer, wherein the oxygen-free copper cavity and the superconducting coil are at a low temperature of 30 mK and configured to carry a NbN resonator sample and provide a magnetic field, respectively; the attenuator and the first-stage amplifier are in a low-temperature environment of a dilution refrigerator, and the DC source, the second-stage amplifier, the vector network analyzer and the control computer are all in a room temperature environment; the DC source is used to provide a voltage needed by the superconducting coil to generate the magnetic field, the superconducting coil is used to provide an externally-applied magnetic field needed by the NbN resonator sample, the vector network analyzer is used to provide a microwave signal to the NbN resonator sample as a microwave input signal which is input through the attenuator into the NbN resonator sample to drive an inductor-capacitor (LC) resonance circuit, an input of the first-stage amplifier is connected to an output of the oxygen-free copper cavity so that the first-stage amplifier amplifies the output microwave signal at a low temperature, an input of the second-stage amplifier is connected to an output of the first-stage amplifier to receive the output signal of the first-stage amplifier for further amplification at a normal temperature, the vector network analyzer is used to measures a forward transmission coefficient $S_{21}$ curve from an input port to an output port of the NbN resonator sample and observe a modulation effect of the magnetic field for the resonance frequency of the LC resonance circuit; the control computer is connected to the vector network analyzer and used to record data measured by the vector network analyzer.

2. The apparatus for implementing a compact and tunable microwave resonator using NbN kinetic inductance according to claim 1, wherein the vector network analyzer is simultaneously connected to an input of the attenuator and an output of the second-stage amplifier.

3. The apparatus for implementing a compact and tunable microwave resonator using NbN kinetic inductance according to claim 1, wherein the output of the second-stage amplifier is directly connected to the vector network analyzer for test.

4. The apparatus for implementing a compact and tunable microwave resonator using NbN kinetic inductance according to claim 1, wherein small A type (SMA) connectors are mounted on both sides of a base of the oxygen-free copper cavity and respectively serves as an input and an output, a printed circuit board (PCB) is mounted on the base of the oxygen-free copper cavity, and the NbN resonator sample is located in a groove of the PCB; a first central conductor of the SMA connector is connected with a second central conductor of the PCB through soldering tin, the second central conductor is connected with a coplanar waveguide transmission line of the NbN resonator sample through an aluminum wire, a lid of the oxygen-free copper cavity is mounted with a coil bobbin, and the superconducting coil is wound on the coil bobbin.

5. The apparatus for implementing a compact and tunable microwave resonator using NbN kinetic inductance according to claim 1, wherein the NbN resonator sample comprises a silicon substrate, a NbN film ground plane, an impedance transformation line and a LC resonance circuit; the silicon substrate is configured as a carrier of the entire NbN resonator sample, the NbN film ground plane, the impedance transformation line and the LC resonance circuit are all fabricated on the silicon substrate, the impedance transformation line is located in the middle of the silicon substrate, and the LC resonance circuit is distributed on one side of the impedance transformation line.

6. The apparatus for implementing a compact and tunable microwave resonator using NbN kinetic inductance according to claim 1, wherein the LC resonance circuit comprises a coupling capacitor, a resonator central conductor and a dc-SQUID; the resonator central conductor is made of a 5-10 nanometer-thick NbN film; the coupling capacitor is configured as a gap capacitor between the resonator central conductor and the impedance transformation line, and both ends of the dc-SQUID are respectively connected to the resonator central conductor and a NbN film ground plane.

7. A method for implementing a compact and tunable microwave resonator using niobium nitride (NbN) kinetic inductance, comprising the following steps:

(1) connecting a vector network analyzer to an input of an attenuator and an output of a second-stage amplifier, respectively, a microwave signal generated by the vector network analyzer being input to an oxygen-free copper cavity carrying a NbN resonator sample through the attenuator and a small A type (SMA) connector, being coupled to an inductor-capacitor (LC) resonance circuit through a second central conductor of a printed circuit board (PCB) and an impedance transformation line of the NbN resonator sample and through a coupling capacitor, and then being output from an output of the oxygen-free copper cavity to obtain a microwave output signal which is amplified through the first-stage amplifier and second-stage amplifier and enters an input of the vector network analyzer, so that a forward transmission coefficient $S_{21}$ curve from an input port to an output port of the NbN resonator sample can be measured, and absorption peaks can be observed;

(2) outputting a voltage from a direct current (DC) source to cause a superconducting coil to generate a desired magnetic field;

(3) upon observing a change in the absorption peak frequency obtained by step (1) and discovering the resonance frequency periodically changes with the voltage applied in step (2), implementing the modulation of the NbN resonator frequency by tuning the voltage to generate the magnetic field;

(4) obtaining the NbN resonator frequency that changes periodically by using a control computer to collect a value of an input voltage of the DC source and data of the forward transmission coefficient $S_{21}$ curve.

* * * * *